United States Patent [19]

Kuramitsu

[11] Patent Number: 5,032,088
[45] Date of Patent: Jul. 16, 1991

[54] GUIDE STRUCTURE FOR A MULTICONTACT CONNECTOR

[75] Inventor: Yuji Kuramitsu, Tokyo, Japan

[73] Assignee: NEC Corporation, Tokyo, Japan

[21] Appl. No.: 458,248

[22] Filed: Dec. 27, 1989

[30] Foreign Application Priority Data

Dec. 28, 1988 [JP] Japan ................. 63-331136

[51] Int. Cl.⁵ ............................................ H01R 13/64
[52] U.S. Cl. ................................................... 439/378
[58] Field of Search ................. 439/78, 374, 375, 376, 439/377, 378, 379, 380, 381, 680, 681

[56] References Cited

U.S. PATENT DOCUMENTS

| | | | |
|---|---|---|---|
| 1,722,816 | 7/1929 | Meunier | 439/378 |
| 3,825,874 | 7/1974 | Peverill | |
| 3,852,700 | 12/1974 | Haws | |
| 3,963,301 | 6/1976 | Stark | 439/680 |
| 4,012,095 | 3/1977 | Doucet et al. | |
| 4,017,696 | 4/1977 | Falk | 179/175 |
| 4,131,934 | 12/1978 | Becker et al. | 439/378 X |
| 4,231,629 | 11/1980 | Kirby | |
| 4,579,406 | 4/1986 | Laursen et al. | |
| 4,611,873 | 9/1986 | Punako et al. | |
| 4,612,601 | 9/1986 | Watari | 361/387 |
| 4,767,341 | 8/1988 | Lund | 439/60 |
| 4,819,131 | 4/1989 | Watari | 361/414 |
| 4,898,538 | 2/1990 | Tratar et al. | 439/378 X |
| 4,934,941 | 6/1990 | Okada | |

FOREIGN PATENT DOCUMENTS 224456 3/1987 European Pat. Off. .
60-68570 4/1985 Japan .

OTHER PUBLICATIONS

IBM Technical Bulletin, vol. 33, No. 1A, Self-Alignment Device for Off-the-Shelf Electrical Connectors, pp. 435–437, 6–1990.
"Coaxial Connector", Heath et al, IBM Technical Disclosure Bulletin, vol. 21, No. 10, pp. 3987–3988 (Mar. 1979).

Primary Examiner—Neil Abrams
Assistant Examiner—Khiem Nguyen
Attorney, Agent, or Firm—Burns, Doane, Swecker & Mathis

[57] ABSTRACT

A guide structure for a multicontact connector which includes a first member having a plurality of first contacts on the underside thereof, a connector housing mounted on a second member and having a plurality of second contacts, a base frame fixed to the second member and surrounding the connector housing, a guide frame having an opening for receiving and retaining the connector housing and having a plurality of guide pins, and a plurality of guide holes formed in the underside of the first member and respectively receiving the plurality of guide pins of the guide frame to enable engagement of the plurality of first contacts with the plurality of second contacts.

20 Claims, 2 Drawing Sheets

GUIDE STRUCTURE FOR A MULTICONTACT CONNECTOR

BACKGROUND OF THE INVENTION

The invention relates to a guide structure for a multicontact connector.

A conventional guide structure for a multicontact connector has a disadvantage in that various structural components thereof need to be dimensioned with considerable accuracy, as will be described in detail later with reference to the accompanying drawing.

SUMMARY OF THE INVENTION

An object of the invention is, therefore, to provide a guide structure for a multicontact connector free from the above-mentioned disadvantage of the conventional guide structure.

According to an aspect of the invention, there is provided a guide structure for a multicontact connector which comprises: a first member having a plurality of first contacts on the underside thereof; a connector housing mounted on a second member and having a plurality of second contacts; a base frame fixed to the second member and surrounding the connector housing, a guide frame having an opening for receiving and retaining the connector housing and a plurality of guide pins; and a plurality of guide holes formed in the underside of the first member and receiving the plurality of guide pins of the guide frame to engage the plurality of first contacts with the plurality of second contacts.

BRIEF DESCRIPTION OF THE DRAWINGS

Other features and advantages will become apparent from the following description when taken in conjunction with the accompanying drawings in which.

DESCRIPTION OF THE PREFERRED EMBODIMENT

Figure 3:
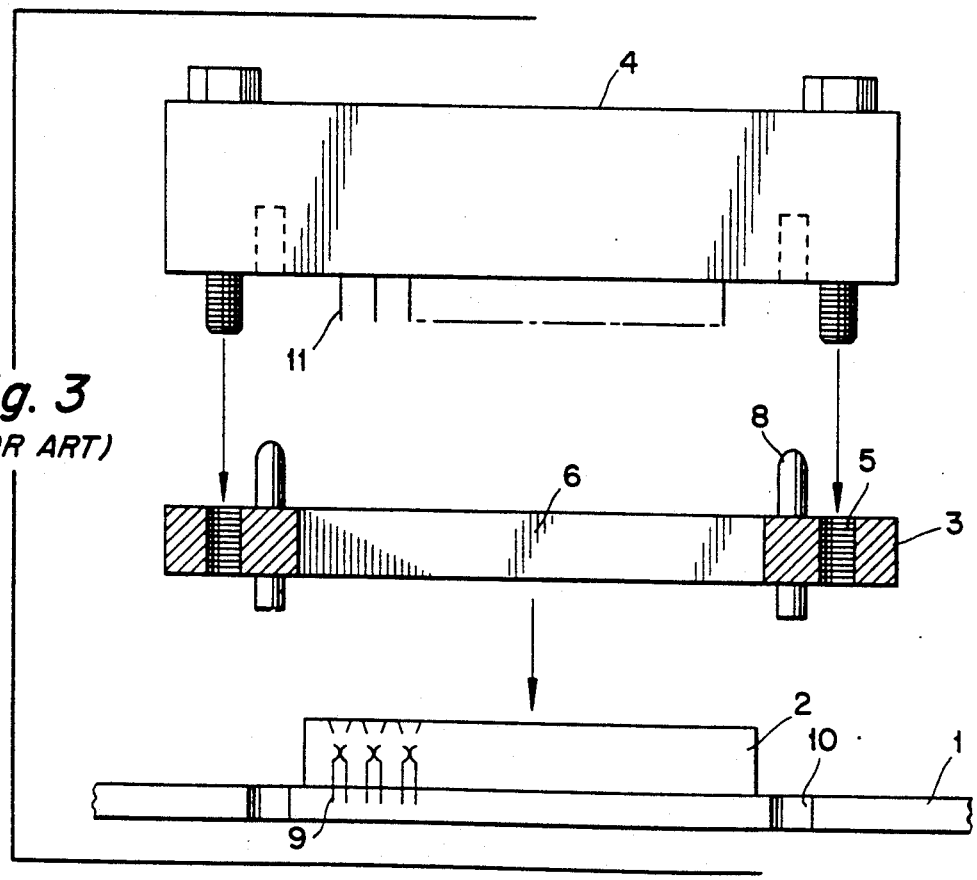
FIG. 3 is a cross-sectional view of a conventional guide structure for a multicontact connector.

To better understand the invention, a brief reference will be made to a conventional guide structure for a multicontact connector shown in FIG. 3. As shown, the conventional structure comprises a base frame 3 in which guide pins 8 are press-fitted for guiding a large scale integrated (LSI) circuit package 4. The guide pins 8 are individually received in reference holes 10 formed through a printed circuit board 1, whereby the base frame 3 is positioned relative to the printed circuit board 1. A plurality of contacts 9 are planted in the printed circuit board 1. Contact pins 11 extending from the LSI circuit package 4 are individually mated with the socket-like contacts 9 while being guided by the guide pins 8 of the base frame 3.

With such a conventional guide structure, it is impossible to insure the accurate and smooth engagement of the contact pins 11 of the LSI circuit package 4 and the contacts 9 of the printed circuit board 1, that is, a connector housing 2 unless the position of the reference holes 10 formed in the printed circuit board 1, the position of the connector housing 2 on the printed circuit board 1, and the position of holes formed in the underside of the LSI circuit package 4 for receiving the pins 8 are provided with extremely high positional accuracy relative to each other.

Figure 1:
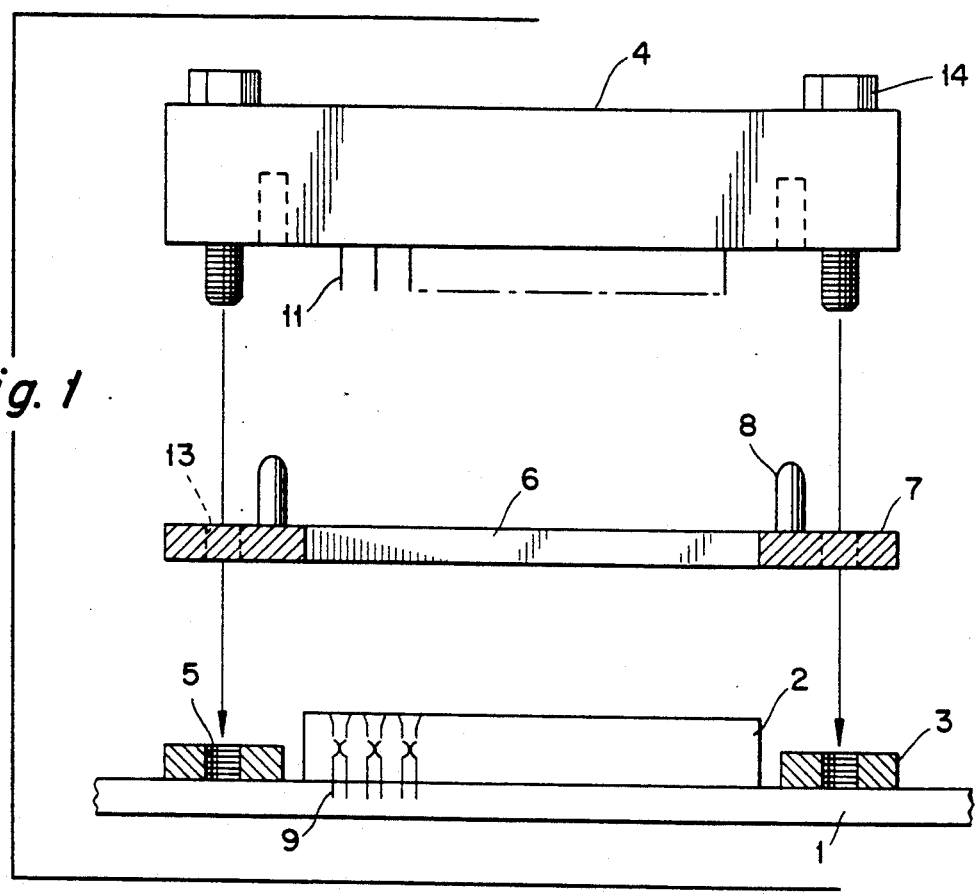
FIG. 1 is cross-sectional view of an embodiment of the present invention.
Figure 2A:
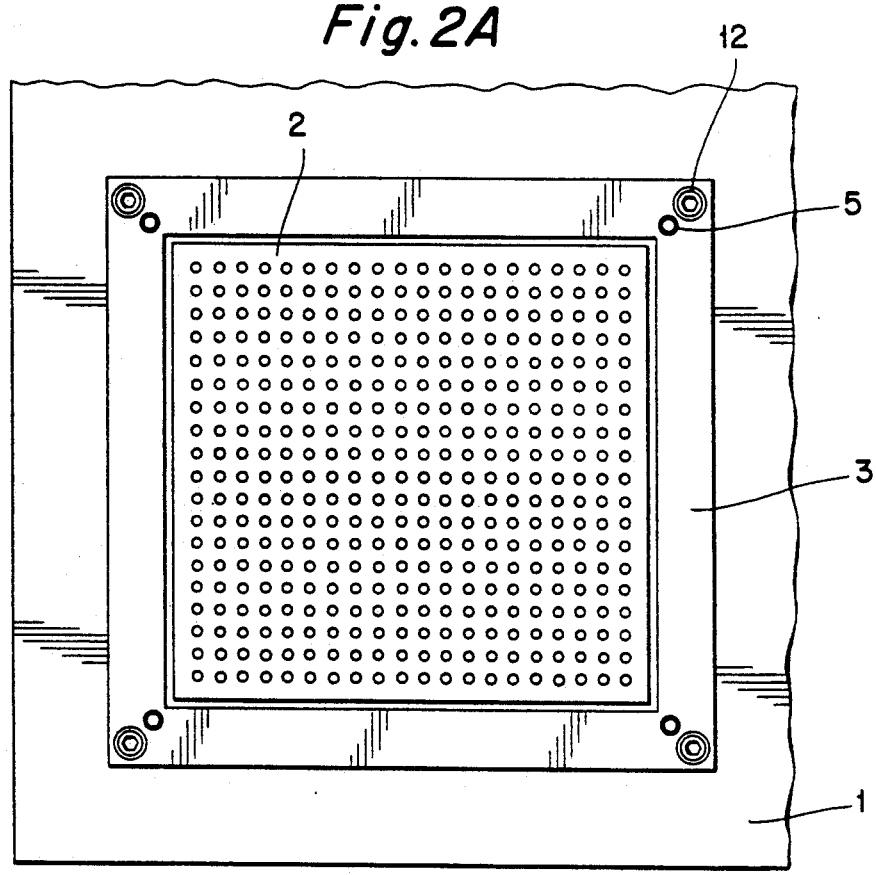
FIGS. 2A and 2B are top plan views of the embodiment shown in FIG. 1.
Figure 2B:
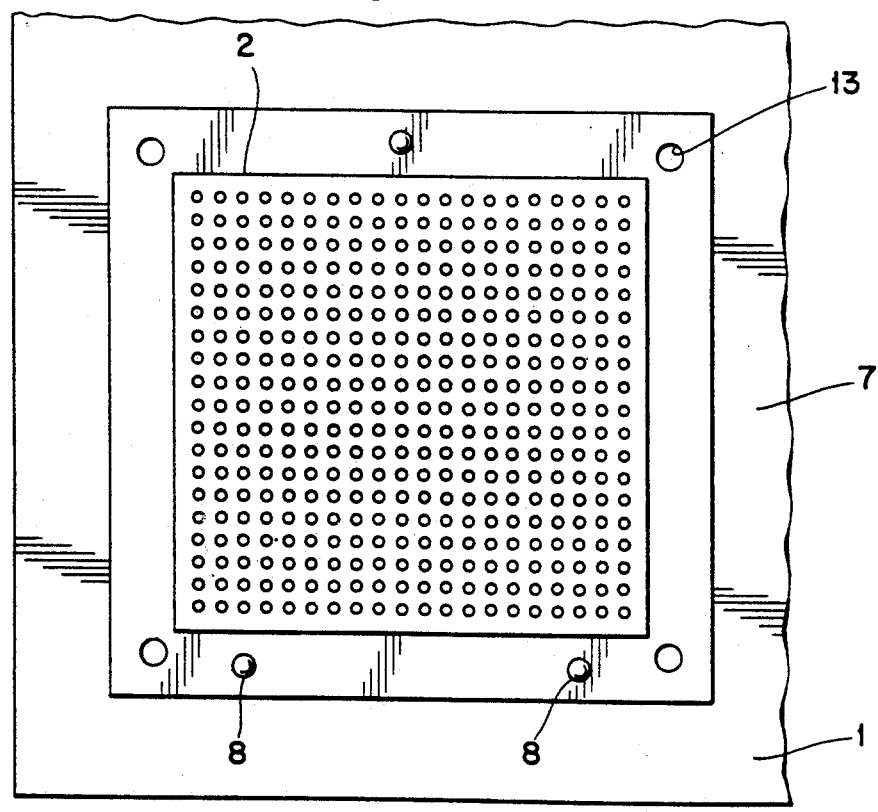

Referring to FIGS. 1, 2A and 2B, an embodiment of the invention is shown. As shown, the guide structure comprises a connector housing 2 provided with a plurality of contacts 9. The connector housing 2 is rigidly mounted on a printed circuit board 1. A base frame 3 is fastened to the printed circuit board 1 by screws 12 as shown in FIG. 2A, while surrounding the connector housing 2. Threaded holes 5 are formed in the four corners of the base frame 3 in order to fasten an LSI circuit chip 4 to the connector housing 2 by screws 14. FIG. 2A shows the the connector housing 2 and base frame 3 in a plan view.

A guide frame 7 guides the LSI chip package 4 when the latter is mated with the connector housing 2. Specifically, the guide frame 7 has an opening 6 and through holes 13. The walls of the opening 6 intimately contact the outer periphery of the connector housing 2. The screws 14 are individually passed through the through holes 13. A plurality of guide pins 8 extend from the guide frame 7 perpendicularly to the underside of the connector housing 2. FIG. 2B shows the connector housing 2 and the guide frame 7 put together.

The guide structure having the above configuration eliminates the disadvantage particular to the conventional structure as stated earlier.

What is claimed is:

1. A guide structure for a multicontact connector comprising:
   a first member having a plurality of first contacts on the underside thereof;
   a connector housing mounted on a second member and having a plurality of second contacts;
   a base frame fixed to said second member and surrounding said connector housing;
   a guide frame having an opening for receiving said connector housing, and having a plurality of guide pins; and
   a plurality of guide holes formed in said underside of said first member and respectively receiving said plurality of guide pins of said guide frame to enable engagement of said plurality of first contacts with said plurality of second contacts.

2. The guide structure for a multicontact connector as set forth in claim 1, wherein said connector housing is rigidly mounted on said second member.

3. The guide structure for a multicontact connector as set forth in claim 1, wherein said base frame is fixed to said second member by screws.

4. The guide structure for a multicontact connector as set forth in claim 1, wherein said base frame has a plurality of threaded holes and said guide frame has a plurality of through holes corresponding to said plurality of threaded holes to enable said first member to be fastened to said base frame by screws respectively positioned in said threaded holes and said through holes.

5. The guide structure for a multicontact connector as set forth in claim 4, wherein said plurality of threaded holes of said base frame are respectively formed in each corner of said base frame.

6. The guide structure for a multicontact connector as set forth in claim 5, wherein said base frame is fixed to said second member by screws.

7. The guide structure for a multicontact connector as set forth in claim 1, wherein said first member is an LSI circuit chip.

8. The guide structure for a multicontact connector as set forth in claim 7, wherein said guide frame guides said LSI circuit chip during engagement of said plurality of first contacts with said of plurality of second contacts.

9. The guide structure for a multicontact connector as set forth in claim 1, wherein said guide frame guides said first member during engagement of said plurality of first contacts with said plurality of second contacts.

10. The guide structure for a multicontact connector as set forth in claim 1, wherein the walls of said opening of said guide frame contact the outer periphery of said connector housing.

11. The guide structure for a multicontact connector as set forth in claim 1, wherein said plurality of guide pins extend from said guide frame perpendicularly to the underside of said connector housing.

12. The guide structure for a multicontact connector as set forth in claim 11, wherein the walls of said opening of said guide frame contact the outer periphery of said connector housing.

13. The guide structure for a multicontact connector as set forth in claim 12, wherein said guide frame guides said first member during engagement of said plurality of first contacts with said plurality of second contacts.

14. The guide structure for a multicontact connector as set forth in claim 13, wherein said base frame has a plurality of threaded holes and said guide frame has a plurality of through holes corresponding to said plurality of threaded holes to enable said first member to be fastened to said base frame by screws respectively positioned in said threaded holes and said through holes.

15. The guide structure for a multicontact connector as set forth in claim 13, wherein said base frame is fixed to said second member by screws.

16. The guide structure for a multicontact connector as set forth in claim 15, wherein said base frame has a plurality of threaded holes and said guide frame has a plurality of through holes corresponding to said plurality of threaded holes to enable said first member to be fastened to said base frame by screws respectively positioned in said threaded holes and said through holes.

17. The guide structure for a multicontact connector as set forth in claim 16, wherein said connector housing is rigidly mounted on said second member.

18. The guide structure for a multicontact connector as set forth in claim 17, wherein said first member is an LSI circuit chip.

19. The guide structure for a multicontact connector as set forth in claim 1, wherein said connector housing is rigidly mounted on said second member, and said base frame is fixed to said second member by screws.

20. The guide structure for a multicontact connector as set forth in claim 19, wherein said base frame has a plurality of threaded holes and said guide frame has a plurality of through holes corresponding to said plurality of threaded holes to enable said first member to be fastened to said base frame by screws respectively positioned in said threaded holes and said through holes.

* * * * *